United States Patent
Cheng (10) Patent No.: US 6,429,987 B1
(45) Date of Patent: Aug. 6, 2002

(54) HIGH SPEED INDUCTOR CURRENT DRIVER WITH MINIMUM OVERSHOOT

(75) Inventor: Chi Fung Cheng, San Jose, CA (US)

(73) Assignee: Marvell International, Inc., Hamilton (BM)

(*) Notice: Subject to any disclaimer, the term of this patent is extended or adjusted under 35 U.S.C. 154(b) by 0 days.

(21) Appl. No.: 09/546,039

(22) Filed: Apr. 10, 2000

(51) Int. Cl.$^7$ .................................................. G11B 5/09
(52) U.S. Cl. ................................ 360/46; 46/360; 46/68
(58) Field of Search .............................. 360/46, 67, 68; 327/108, 110, 309, 310, 300, 304

(56) References Cited

U.S. PATENT DOCUMENTS

| | | |
|---|---|---|
| 5,386,328 A | 1/1995 | Chiou et al. |
| 5,612,828 A | 3/1997 | Brannon et al. |
| 5,822,141 A | 10/1998 | Chung et al. |
| 5,869,988 A | 2/1999 | Jusuf et al. |
| 6,246,269 B1 * | 6/2001 | Schuler et al. ............... 360/68 |

* cited by examiner

*Primary Examiner*—Alan T. Faber
(74) *Attorney, Agent, or Firm*—Eric B. Janofsky (57) ABSTRACT

A high speed write driver for an inductive head of a magnetic storage medium is provided which contains a mechanism to reduce the inductive head current overshoot and therefore reduce jitter and, thus, increase the write cycle frequency. An input voltage control stage controls a voltage applied to the inductive head from the voltage source. A current supply to supplies current to the inductive head element, and a damping circuit in communication with the inductive head element. An overshoot suppressor circuit is provided such that the input voltage control tage is responsive to the overshoot suppressor circuit.

54 Claims, 4 Drawing Sheets

HIGH SPEED INDUCTOR CURRENT DRIVER WITH MINIMUM OVERSHOOT

BACKGROUND OF THE INVENTION

1. Field of the Invention

The invention relates to write drivers for an inductive head in a magnetic data storage system, and particularly to write drivers designed to operate at high rates of data transfer.

2. Description of Related Art

Conventional storage systems include an inductive head that uses an inductive element to write information on a recording surface of a magnetic media, such as a magnetic disk. The inductive element usually is an inductive coil that writes information by creating a changing magnetic field. A write driver circuit is connected to the inductive at first and second head nodes. During writing operations, the write driver circuit forces a relatively large write current through the inductive coil to create a magnetic field that polarizes adjacent bit positions on a recording surface. Digital information is stored by reversing the polarization of selected bit positions which is done by reversing the direction of the current flow in the inductive head.

The rate at which information can be stored on a recording surface through the inductive head is directly proportional to the rate at which the direction of current can be reversed in the inductive coil. The rise/fall time of the inductive coil is determined by:

$$di/dt = V/L$$

where $di/dt$ is the rate of change of the write current, V is the available voltage across the inductive coil and L is the head inductance. Therefore the rise time is inversely proportional to the available voltage across the inductive coil.

There is, however, a fundamental limit as to how fast current can change in an inductive head due to its capacitance, parasitic capacitance and write driver capacitance. The combination of inductance and capacitance produces ringing which in conventional high speed write drivers can be controlled by means of a damping resistor coupled across the inductive head. Another limitation on performance of high speed drivers is the current overshoot which occurs in the inductive head element after the current reaches its threshold. The overshoot can cause significant data dependent jitter.

Four U.S. patents are known to deal with magnetic media high speed current drivers.

U.S. Pat. No. 5,386,328 (Chiou, et al.) describes a current mirror based write driver to operate inductive heads for magnetic recording. The write driver has a head voltage that swings between the upper and lower supply rails and thus may be used with CMOS circuits or differential ECL circuits. The 3.3V write driver maintains the same performance characteristics as magnetic recording devices that are powered at supply voltage levels of 5V and 12V.

U.S. Pat. No. 5,822,141 (Chung, et al.) discloses a high speed FET write driver for an inductive head. The FET write driver provides high rate of data transfer to a magnetic storage medium by effectively using the voltage swing provided by the supply voltage. During operation, the low voltage drops across the FET switches allow for a substantial portion of the supply voltage to be available across the inductive head. The circuit is inherently stable and avoids ringing and overshoot which results in improved timing and maintains signal integrity. This patent does not provide a means for controlling current overshoot resulting from the fast rise time of the inductive head write current.

U.S. Pat. No. 5,612,828 (Brannon, et al.) teaches a write driver circuit for driving a magnetic head in an information storage system. The write driver circuit is connected to first and second voltage supply terminals and includes first and second data input terminals for receiving data input signals. The write driver circuit is formed of an H-switch to switch current flow through the magnetic head. A pair of anti-saturation circuits is connected to the H-switch to bias the pull-up transistors of the H-switch U.S. Pat. No. 5,869,988 (Jusuf, et al.) discloses a high-speed write driver for inductive heads of a magnetic storage medium. The write driver induces a faster write current reversal in an inductive head element by using two significant improvements that operate during the current switch cycle. One is a current boost mechanism to generate a faster rise time when the current switches direction through the inductive head element and the other is a mechanism to reduce the damping resistor effect during the current reversal time.

SUMMARY OF THE INVENTION

The present invention describes a high speed write driver for an inductive head of a magnetic storage medium which contains a mechanism to reduce the inductive head current overshoot and therefore reduce jitter and, thus, increase the write cycle frequency. The write driver is comprised of a pair of switches, S1 and S2 coupled to a pair of current sources, I1 and I2. Current source I1 is controlled by first control signal CKNL and current source I2 is controlled by second control signal CKNR which is complementary to CKNL. The first switch S1 is coupled to the first current source I1, and is controlled by first switch control signal CKPL, and the second switch S2 is coupled to the second current source I2 and is controlled by second switch control signal CKPR. In one embodiment, a current booster is coupled to each current source to boost the write current and increase the write current rate of change during current switch transitions; a programmable damping resistor Rd is incorporated in order to momentarily increase Rd and, thus, increase write current and write current rate of change during current switch transitions; switches S1 and S2 which are controlled, respectively, by CKPL and CKPR to maximize rail to rail voltage swing and to suppress current overshoot in the inductive head element by momentarily forcing the voltage across the inductive head element to zero when the threshold current is reached. Other embodiments incorporating the current overshoot suppression with and without the current booster and with or without the programmable resistor are possible.

DESCRIPTION OF PREFERRED EMBODIMENT

Figure 1:
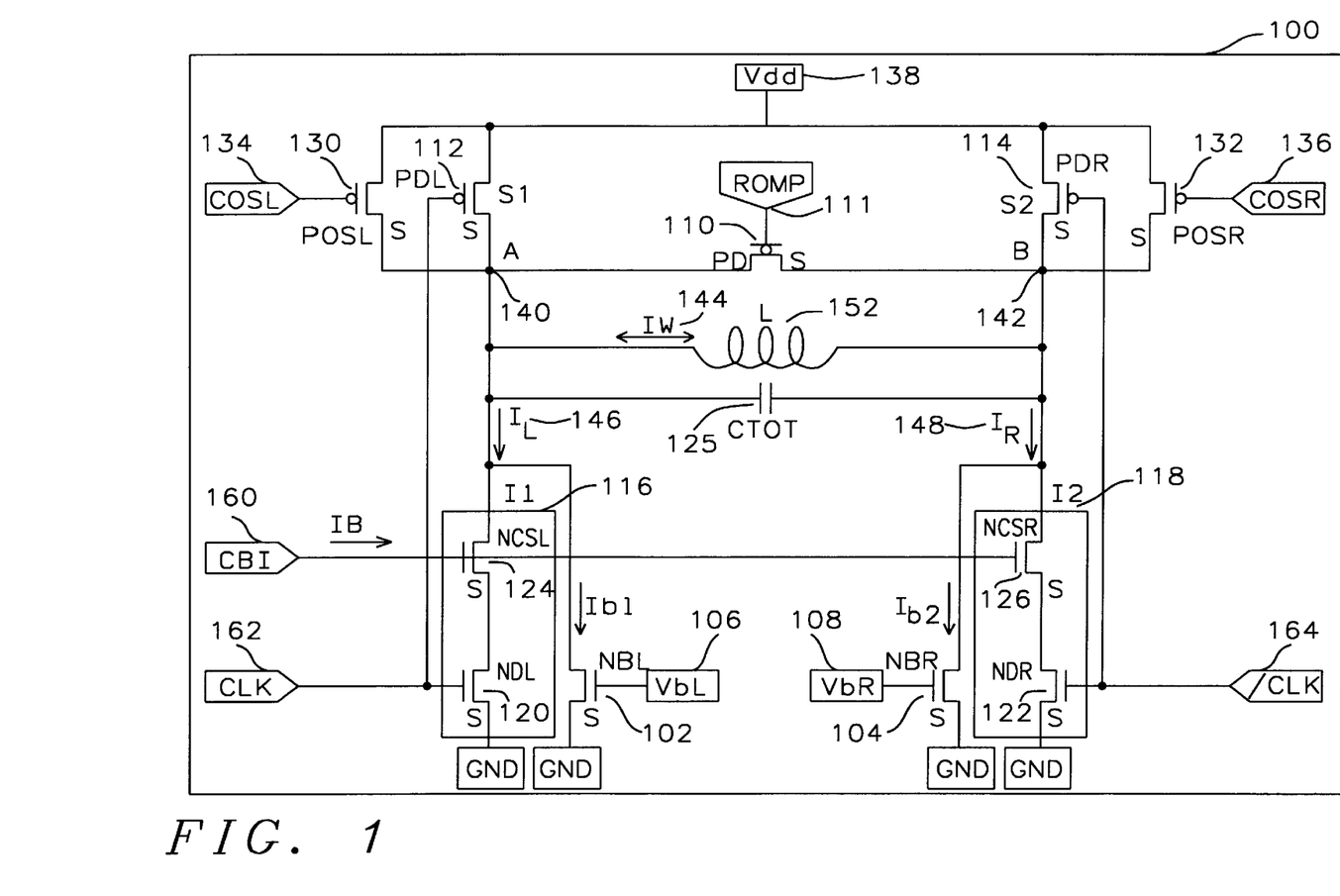
FIG. 1 illustrates a high speed write driver constructed in accordance with the principles of this invention.

FIG. 1 illustrates a high speed write driver 100 described in accordance with the principles of this invention. Write driver 100 induces a faster write current switch across an inductive head element 152 of a magnetic storage device comprising an input voltage control stage. The input voltage control stage comprises a pair of switches, including a first switch (S1) 112 and a second switch (S2) 114, comprising PMOS transistors PDL and PDR respectively, coupled to a pair of current sources comprising, a first current source circuit (I1) 116 that includes a first NMOS transistor (NDL) 120 coupled to a second NMOS transistor (NCSL) 124 which is coupled to a current bias source (CBI) 160 and a second current source circuit (I2) 118 comprising a third NMOS transistor (NDR) 122 coupled to a fourth NMOS transistor (NCSR) 126 which is also coupled to the current bias source (CBI) 160. The pair of switches further comprises switch S1 112 coupled between a voltage source (Vdd) 138 and the first node (A) 140 of damping resistor (PD) 110. Node A 140 is also coupled to current source I1 116. A first current switch control signal (CLK) 162 is coupled to control transistor NDL 120 of current source I1 116 and to switch S1 112 to generate a rail to rail voltage swing at node A 140 of damping resistor PD 110. Switch S2 114 is coupled between the voltage source Vdd 138 and to second node (B) 142 of damping resistor PD 110. Node B 142 of damping resistor PD 110 also being coupled to current source (I2) 118. A second current switch control signal (/CLK) 164, signal /CLK 164 being a complimentary signal of CLK 162, is coupled to control transistor NDR 122 of current source I2 118 and to switch S2 114 to also produce a rail to rail voltage swing at node B 142 of damping resistor PD 110. During a clock transition, such as when CLK 162 transitions from LOW to HIGH, current source I1 116 switches ON to allow current flow IL 146, while switch S1 112 correspondingly switches OFF to de-couple from voltage source Vdd 138. Concurrently, switch S2 114 switches ON when /CLK signal 164 transitions HIGH to LOW, thereby pulling node B 142 quickly to voltage Vdd value, while current source I2 118 shuts OFF, blocking current flow IR 148. Consequently, IW 144 quickly switches the direction of its flow, such as to flow from node B to node A rather than from node A to node B, thus corresponding to a fast write current change.

Figure 2:
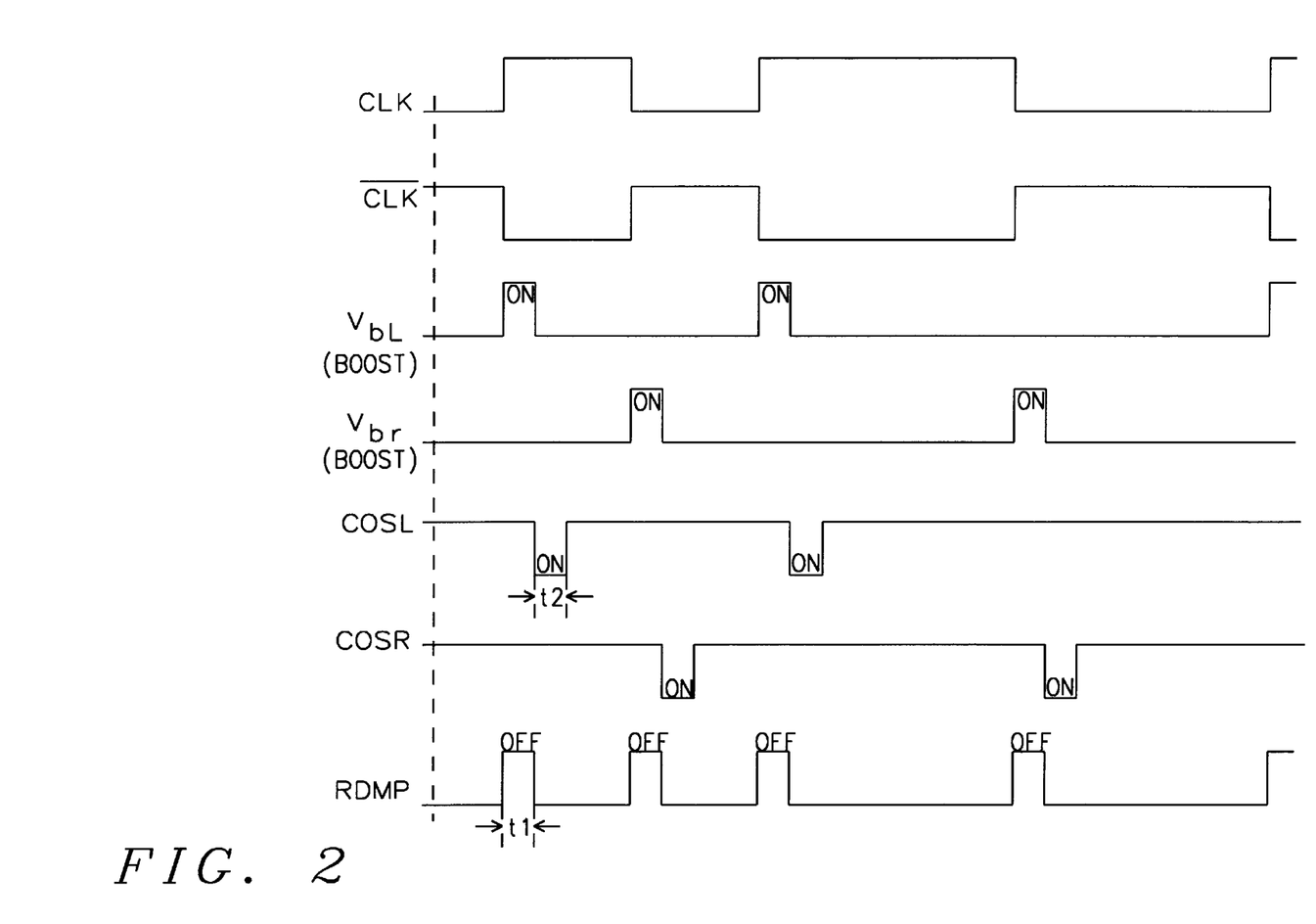
FIG. 2 illustrates a timing diagram for the high speed write driver of FIG. 1.

Current sources 116 and 118 constitute a current supply. A capacitance (Ctot) 125 is shown to represent the parasitic capacitance of inductive head element (L) 152, its parasitic capacitance, and the capacitance of the write driver. Write driver 100 further comprises a pair of additional current boosters including a first current booster transistor (NBL) 102 coupled to current source I1 116 and a second current booster transistor (NBR) 104 coupled to current source I2 118. As illustrated in the timing diagram of FIG. 2, current booster NBL 102 is controlled by first booster control signal (VbI) 106 that is triggered by a rising edge of CLK signal so that current IbI from booster circuit NBL is added to current source I1 116 current to increase current IL 146 during CLK transition from LOW to HIGH. Since current IW 144 is proportional to IL 146 during CLK transition from LOW to HIGH, the increased current of IL 146 from current booster NBL 102 produces a faster rise time of write current Iw 144. Similarly, current booster NBR 104 is controlled by a second booster control signal (Vbr) 108 that is triggered by the rising edge of /CLK signal so that current from booster circuit NBR is added to current from current source I2 118 to increase current (IR) 148 during /CLK transition from LOW to HIGH. The write driver 100 further comprises a programmable active damping resistor PD 110. The programmable resistor PD 110 is controlled by a timing signal RDMP 111 which is coupled to be triggered by a falling edge of both, CLK 162 and /CLK 164. Timing signal RDMP 111 controls the value of PD 110 such as to switch between a desired low resistance value Rd and a high value when PD 110 is OFF. As illustrated in FIG. 2 at the beginning of a write operation, i.e. when CLK 162 transitions from LOW to HIGH, damping resistor PD 110 is HIGH for a short time period t1, essentially removing PD 110 from the circuit and, thereby speeding up the fall time of write current IL 146 to generate a faster write operation. Similarly, when /CLK 164 transitions from LOW to HIGH, damping resistor PD 110 is OFF for a short time period t1, thereby speeding up the rise time of current Iw 144. Thus, the improvement to the rise and fall times of the driver due to the programmable resistor PD 110 is accomplished without need to increase driver power consumption.

The write driver further comprises a pair of switching transistors (POSL) 130 and (POSR) 132 which provide a mechanism for current overshoot suppression. Transistor POSL is of the same type as switch S1 transistor PDL and is coupled in parallel with transistor PDL, i.e. it is identically coupled between Vdd 138 and node A 140 of the damping resistor PD 110. The control signal (COSL) 134 of transistor POSL 130 is triggered by the falling edge of booster control signal VbI 106 to turn transistor POSL 130 ON for a short period t2, thereby forcing the voltage across the inductive head element L 152 to zero, transistor PDR 114 of switch S2 also being ON during this time. Similarly, transistor POSR is of the same type as transistor PDR 114 of switch S2 and is coupled in parallel with transistor PDR 114. The control signal (COSR) 136 of transistor POSR 132 is triggered by the falling edge of booster control signal Vbr 108 to turn transistor POSR 132 ON for the short period t2 to force the voltage across the inductor L 152 to zero. During the boost periods the inductor current reaches the threshold value and the action of POSL and POSR, by forcing the voltage across the inductor to zero, reduces the rate of change of current in the inductor L 152 to zero, stabilizing the inductor current and significantly suppressing current overshoot without compromising the rise and fall times. FIG. 2 which illustrates the timing diagram for the write driver 100 depicts the idealized control timing for overshoot suppressor transistors POSL and POSR.

Figure 3:
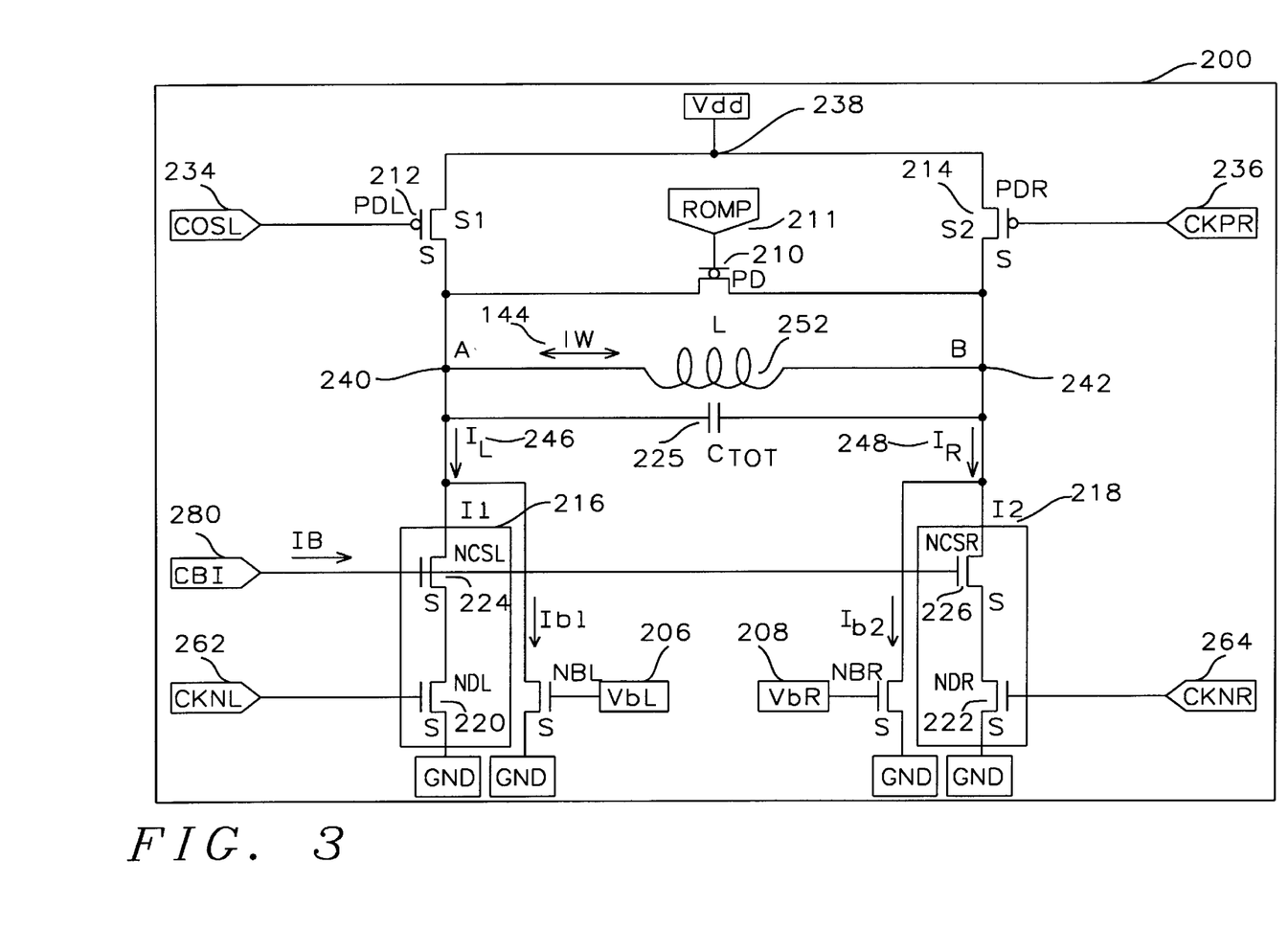
FIG. 3 illustrates an alternative and the preferred embodiment of a high speed write driver shown in FIG. 1.
Figure 4:
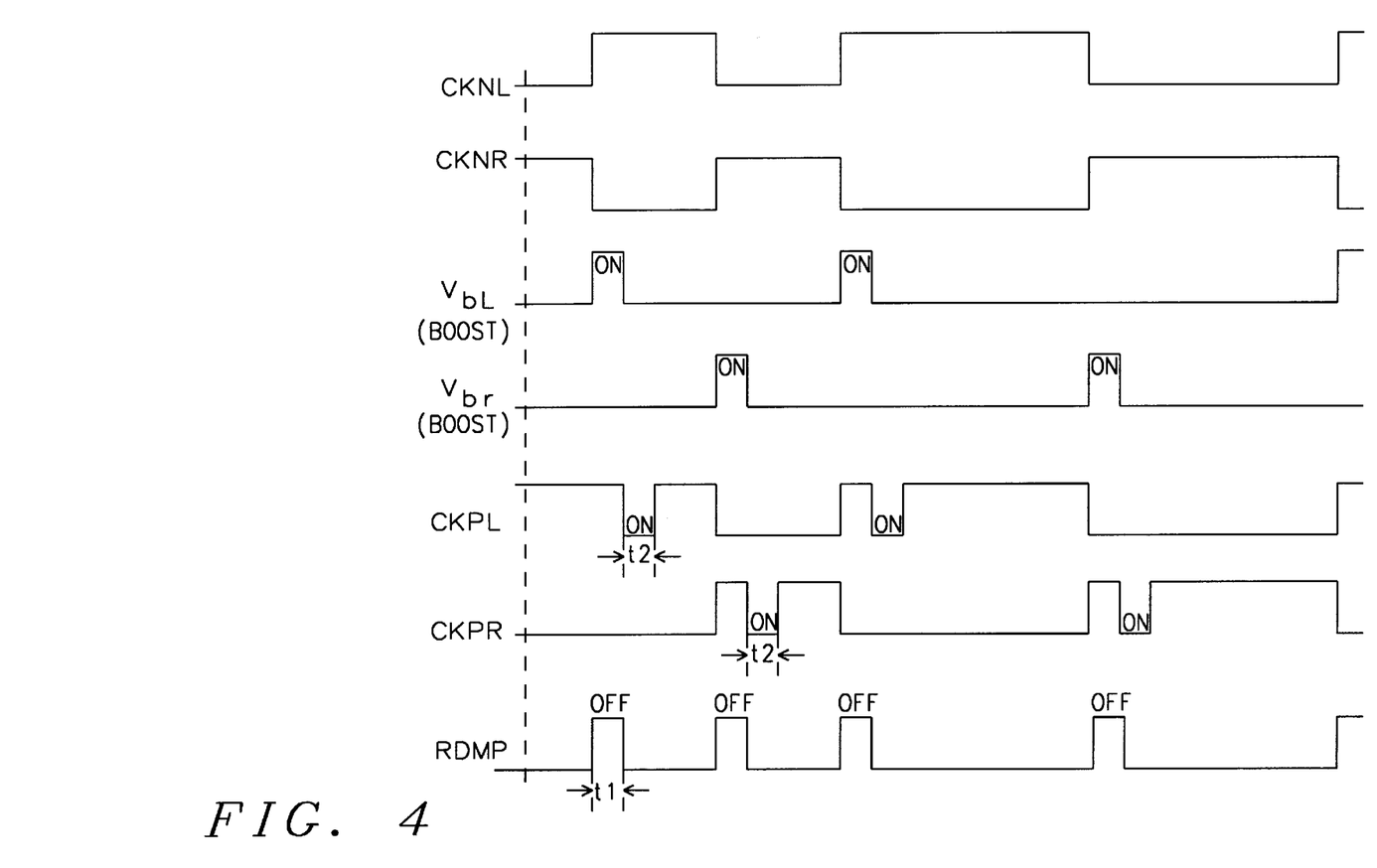
FIG. 4 illustrates a timing diagram for the high speed write driver of FIG. 3.

FIG. 3 illustrates an alternative embodiment of a high speed write driver described in accordance to the principles of this invention. Write driver 200 operates essentially as described for write driver 100 of FIG. 1. However, in this embodiment the function of overshoot suppressing transistors POSL and POSR has been incorporated respectively, into switch S1 transistor (PDL) 212 and into switch S2 transistor (PDR) 214. The control signals of transistors PDL 212 and PDR 214 have been appropriately modified to implement the new combined function. Thus, the PDL 212 control signal (CKPL) 234 in FIG. 3 becomes the logical superposition of control signal CLK 164 and control signal COSL 134 of FIG. 1. The resulting timing diagram is shown in FIG. 4. Similarly, the PDR 214 control signal (CKPR) 236 in FIG. 3 becomes the logical superposition of control signal /CLK 164 and control signal COSR 136 of FIG. 1. The resulting timing diagram is also shown in FIG. 4. The control signal CLK 162 of FIG.1 is de-coupled from switch S1 transistor PDL112 and becomes the control signal (CKNL) 262 which is coupled only to current source I1 216 transistor NDL 220. Similarly, the control signal /CLK 164 of FIG.1 is de-coupled from switch S2 transistor PDR 114 and becomes the control signal (CKNR) 264 which is coupled only to current source I2 218 transistor NDR 222. The high speed driver 200 depicted in FIG. 3 compared to the write driver 100 of FIG. 1 has a reduced footprint, lower capacitance and lower power consumption and, therefore, is the preferred implementation.

While the write driver implementation depicted in FIG. 1 and FIG. 3 has the pair of switches comprised of PMOS transistors and the pair of current sources comprised of NMOS transistors, an implementation which embodies the principles of this invention and is comprised of NMOS transistors for the pair of switches and PMOS transistors for the pair of current sources is not precluded. In such an implementation, the positive supply voltage Vdd would be reversed and a negative supply voltage would be provided.

While the write amplifiers depicted in FIG. 1 and in FIG. 3 are illustrated in CMOS technology, the concepts described in accordance to the principles of this invention are applicable to other types of process technology, such as MOS or Bipolar.

The advantages of the present invention are:

Rise and fall time of write current is reduced.

Write current overshoot is reduced.

Driver write frequency is increased with minimum jitter.

While the invention has been particularly shown and described with reference to the preferred embodiments thereof, it will be understood by those skilled in the art that various changes in form and details may be made without departing from the spirit and scope of the invention.

What is claimed is:

1. A high speed write driver to drive an inductive head element having first and second terminals from a voltage source having first and second terminals in accordance with a controller, said high speed write driver comprising:

an input voltage control stage to control a voltage applied to the inductive head from the voltage source;

a current supply to supply current to the inductive head element;

a damping circuit in communication with the inductive head element; and an overshoot suppressor circuit, wherein said input voltage control stage is responsive to said overshoot suppressor circuit, wherein said input control stage comprises:

a first switch having a first terminal in communication with the first terminal of the voltage source and a second terminal in communication with the first terminal of the inductive head element; and a second switch having a first terminal in communication with the first terminal of the voltage source and a second terminal in communication with the second terminal of the inductive head element;

wherein said damping circuit is in communication with the first and second terminals of the inductive head element; and wherein said overshoot suppressor circuit comprises:

a third switch having a first terminal in communication with the first terminal of the voltage source and a second terminal in communication with the first terminal of the inductive head element; and a fourth switch having a first terminal in communication with the first terminal of the voltage source and a second terminal in communication with the second terminal of the inductive head element, wherein said current supply comprises: a first current source having a first terminal in communication with the first terminal of the inductive head element and a second terminal in communication with the second terminal of the voltage source; and a second current source having a first terminal in communication with the second terminal of the inductive head element and a second terminal in communication with the second terminal of the voltage source, and said current supply further comprises a first current boost circuit in communication with the first terminal of the inductive head element and a second current boost circuit in communication with the second terminal of the inductive head element.

2. A high speed write driver according to claim 1, wherein the controller provides: a first clock signal to said first switch and said first current source;

a complement of the first clock signal to said second switch and said second current source;

a first boost signal to said first current boost circuit which is triggered by a rising edge of the first clock signal;

a second boost signal to said second current boost circuit which is triggered by a rising edge of the complement of the first clock signal;

a damping control signal to said damping circuit which is triggered by the rising edge of the first clock signal and the rising edge of the complement of the first clock signal;

a first overshoot control signal to said third switch which is triggered by a falling edge of the first boost signal; and a second overshoot control signal to said fourth switch which is triggered by a falling edge of the second boost signal.

3. A high speed write driver to drive an inductive head element having first and second terminals from a voltage source having first and second terminals in accordance with a controller, said high speed write driver comprising:

an input voltage control stage to control a voltage applied to the inductive head from the voltage source;

a current supply to supply current to the inductive head element;

a damping circuit in communication with the inductive head element; and an overshoot suppressor circuit, wherein said input voltage control stage is responsive to said overshoot suppressor circuit, said current supply further comprises a current booster.

4. A high speed write driver according to claim 3, wherein said input control stage comprises:

a first switch having a first terminal in communication with the first terminal of the voltage source and a second terminal in communication with the first terminal of the inductive head element; and a second switch having a first terminal in communication with the first terminal of the voltage source and a second terminal in communication with the second terminal of the inductive head element;

wherein said damping circuit is in communication with the first and second terminals of the inductive head element; and wherein said overshoot suppressor circuit comprises:

a third switch having a first terminal in communication with the first terminal of the voltage source and a second terminal in communication with the first terminal of the inductive head element; and a fourth switch having a first terminal in communication with the first terminal of the voltage source and a second terminal in communication with the second terminal of the inductive head element.

5. A high speed write driver according to claim 3, wherein said damping circuit comprises a controllable resistance.

6. A high speed write driver according to claim 3, wherein said current supply comprises: a first current source having a first terminal in communication with the first terminal of the inductive head element and a second terminal in communication with the second terminal of the voltage source; and a second current source having a first terminal in communication with the second terminal of the inductive head element and a second terminal in communication with the second terminal of the voltage source.

7. A high speed write driver to drive an inductive head element having first and second terminals from a voltage source having first and second terminals in accordance with a controller, said high speed write driver comprising:
   an input voltage control and overshoot suppress stage to control a voltage and to suppress voltage overshoot applied to the inductive head from the voltage source;
   a current supply to supply current to the inductive head element; and
   a damping circuit in communication with the inductive head,
   wherein said input control and suppressor stage comprises:
      a first switch having a first terminal in communication with the first terminal of the voltage source and a second terminal in communication with the first terminal of the inductive head element; and
      a second switch having a first terminal in communication with the first terminal of the voltage source and a second terminal in communication with the second terminal of the inductive head element;
   wherein said damping circuit is in communication with the first and second terminals of the inductive head element,
   wherein said current supply comprises:
      a first current source having a first terminal in communication with the first terminal of the inductive head element and a second terminal in communication with the second terminal of the voltage source; and
      a second current source having a first terminal in communication with the second terminal of the inductive head element and a second terminal in communication with the second terminal of the voltage source,
   wherein said current supply further comprises a first current boost circuit in communication with the first terminal of the inductive head element and a second current boost circuit in communication with the second terminal of the inductive head element.

8. A high speed write driver according to claim 7, wherein said input control and suppressor stage comprises:
   a first switch having a first terminal in communication with the first terminal of the voltage source and a second terminal in communication with the first terminal of the inductive head element; and
   a second switch having a first terminal in communication with the first terminal of the voltage source and a second terminal in communication with the second terminal of the inductive head element;
   wherein said damping circuit is in communication with the first and second terminals of the inductive head element.

9. A high speed write driver according to claim 7, wherein said damping circuit comprises a controllable resistance.

10. A high speed write driver according to claim 7, wherein said current supply comprises:
    a first current source having a first terminal in communication with the first terminal of the inductive head element and a second terminal in communication with the second terminal of the voltage source; and
    a second current source having a first terminal in communication with the second terminal of the inductive head element and a second terminal in communication with the second terminal of the voltage source.

11. A high speed write driver according to claim 7, wherein the controller provides:
    a first clock signal to said first current source;
    a complement of the first clock signal to said second current source;
    a first boost signal to said first current boost circuit which is triggered by a rising edge of the first clock signal;
    a second boost signal to said second current boost circuit which is triggered by a rising edge of the complement of the first control signal;
    a damping control signal to said damping circuit which is triggered by the rising edge of the first clock signal and the rising edge of the complement of the first clock signal;
    a first voltage and suppression control signal to said first switch which is triggered by a falling edge of the first boost signal and a falling edge of the first clock signal; and
    a second voltage and suppression control signal to said second switch which is triggered by a falling edge of the second boost signal and a falling edge of the complement of the first clock signal.

12. A high speed write driver to drive an inductive head element having first and second terminals from a voltage source having first and second terminals in accordance with a controller, said high speed write driver comprising:
    an input voltage control and overshoot suppress stage to control a voltage and to suppress voltage overshoot applied to the inductive head from the voltage source;
    a current supply to supply current to the inductive head element; and
    a damping circuit in communication with the inductive head,
    said current supply further comprises a current booster.

13. A storage system comprising:
    an inductive head element having first and second terminals;
    a controller;
    a voltage source having first and second terminals;
    a high speed write driver to drive said inductive head with a voltage from said voltage source in accordance with said controller, said high speed write driver comprising:
       an input voltage control stage to control a voltage applied to the inductive head from said voltage source;
       a current supply to supply current to said inductive head element;
       a damping circuit in communication with said inductive head element; and
       a overshoot suppressor circuit, wherein said input voltage control stage is responsive to said overshoot suppressor circuit, wherein said input control stage comprises:
a first switch having a first terminal in communication with the first terminal of the voltage source and a second terminal in communication with the first terminal of said inductive head element; and
a second switch having a first terminal in communication with the first terminal of the voltage source and a second terminal in communication with the second terminal of said inductive head element;
wherein said damping circuit is in communication with the first and second terminals of said inductive head element; and
wherein said overshoot suppressor circuit comprises:
a third switch having a first terminal in communication with the first terminal of said voltage source and a second terminal in communication with the first terminal of said inductive head element; and
a fourth switch having a first terminal in communication with the first terminal of said voltage source and a second terminal in communication with the second terminal of said inductive head element,
wherein said current supply comprises:
a first current source having a first terminal in communication with the first terminal of said inductive head element and a second terminal in communication with a second terminal of said voltage source; and
a second current source having a first terminal in communication with the second terminal of said inductive head element and the second terminal in communication with a second terminal of said voltage source,
said current supply further comprises a first current boost circuit in communication with the first terminal of said inductive head element and a second current boost circuit in communication with the second terminal of said inductive head element.

14. A storage system according to claim 13, wherein said controller generates:
a first clock signal to said first switch and said first current source;
a complement of the first clock signal to said second switch and said second current source;
a first boost signal to said first current boost circuit which is triggered by a rising edge of the first clock signal;
a second boost signal to said second current boost circuit which is triggered by a rising edge of the complement of the first clock signal;
a damping control signal to said damping circuit which is triggered by the rising edge of the first clock signal and the rising edge of the complement of the first clock signal;
a first overshoot control signal to said third switch which is triggered by a falling edge of the first boost signal; and
a second overshoot control signal to said fourth switch which is triggered by a falling edge of the second boost signal.

15. A storage system comprising:
an inductive head element having first and second terminals;
a controller;
a voltage source having first and second terminals;
a high speed write driver to drive said inductive head with a voltage from said voltage source in accordance with said controller, said high speed write driver comprising:
an input voltage control stage to control a voltage applied to the inductive head from said voltage source;
a current supply to supply current to said inductive head element;
a damping circuit in communication with said inductive head element; and
a overshoot suppressor circuit, wherein said input voltage control stage is responsive to said overshoot suppressor circuit,
said current supply further comprises a current booster.

16. A storage system according to claim 15, wherein said input control stage comprises:
a first switch having a first terminal in communication with the first terminal of the voltage source and a second terminal in communication with the first terminal of said inductive head element; and
a second switch having a first terminal in communication with the first terminal of the voltage source and a second terminal in communication with the second terminal of said inductive head element;
wherein said damping circuit is in communication with the first and second terminals of said inductive head element; and
wherein said overshoot suppressor circuit comprises:
a third switch having a first terminal in communication with the first terminal of said voltage source and a second terminal in communication with the first terminal of said inductive head element; and
a fourth switch having a first terminal in communication with the first terminal of said voltage source and a second terminal in communication with the second terminal of said inductive head element.

17. A storage system according to claim 15, wherein said damping circuit comprises a controllable resistance.

18. A storage system according to claim 15, wherein said current supply comprises:
a first current source having a first terminal in communication with the first terminal of said inductive head element and a second terminal in communication with a second terminal of said voltage source; and
a second current source having a first terminal in communication with the second terminal of said inductive head element and the second terminal in communication with a second terminal of said voltage source.

19. A storage system comprising:
an inductive head element having first and second terminals;
a controller;
a voltage source having first and second terminals;
a high speed write driver to drive said inductive head with a voltage from said voltage source in accordance with said controller, said high speed write driver comprising:
an input voltage control and overshoot suppress stage to control a voltage and to suppress voltage overshoot applied to said inductive head from said voltage source;
a current supply to supply current to said inductive head element; and
a damping circuit in communication with the inductive head,
wherein said input control and suppressor stage comprises:
a first switch having a first terminal in communication with the first terminal of said voltage source and a second terminal in communication with the first terminal of said inductive head element; and a second switch having a first terminal in communication with the first terminal of said voltage source and a second terminal in communication with the second terminal of said inductive head element; and wherein said damping circuit is in communication with the first and second terminals of said inductive head element, wherein said current supply comprises:

a first current source having a first terminal in communication with the first terminal of said inductive head element and a second terminal in communication with the second terminal of said voltage source; and a second current source having a first terminal in communication with the second terminal of said inductive head element and a second terminal in communication with the second terminal of said voltage source, said current supply further comprises a first current boost circuit in communication with the first terminal of the inductive head element and a second current boost circuit in communication with the second terminal of the inductive head element.

20. A storage system according to claim 19, wherein said controller generates:

a first clock signal to said first current source;

a complement of the first clock signal to said second current source;

a first boost signal to said first current boost circuit which is triggered by a rising edge of the first clock signal;

a second boost signal to said second current boost circuit which is triggered by a rising edge of the complement of the first control signal;

a damping control signal to said damping circuit which is triggered by a rising edge of the first clock signal and the rising edge of the complement of the first clock signal;

a first voltage and suppression control signal to said first switch which is triggered by a falling edge of the first boost signal and a falling edge of the first clock signal; and a second voltage and suppression control signal to said second switch which is triggered by a falling edge of the second boost signal and a falling edge of the complement of the first clock signal.

21. A storage system comprising:

an inductive head element having first and second terminals;

a controller;

a voltage source having first and second terminals;

a high speed write driver to drive said inductive head with a voltage from said voltage source in accordance with said controller, said high speed write driver comprising:

an input voltage control and overshoot suppress stage to control a voltage and to suppress voltage overshoot applied to said inductive head from said voltage source;

a current supply to supply current to said inductive head element; and a damping circuit in communication with the inductive head, said current supply further comprises a current booster.

22. A storage system according to claim 21, wherein said input control and suppressor stage comprises:

a first switch having a first terminal in communication with the first terminal of said voltage source and a second terminal in communication with the first terminal of said inductive head element; and a second switch having a first terminal in communication with the first terminal of said voltage source and a second terminal in communication with the second terminal of said inductive head element; and wherein said damping circuit is in communication with the first and second terminals of said inductive head element.

23. A storage system according to claim 21, wherein said damping circuit comprises a controllable resistance.

24. A storage system according to claim 21, wherein said current supply comprises:

a first current source having a first terminal in communication with the first terminal of said inductive head element and a second terminal in communication with the second terminal of said voltage source; and a second current source having a first terminal in communication with the second terminal of said inductive head element and a second terminal in communication with the second terminal of said voltage source.

25. A high speed write driver to drive an inductive head element having first and second terminals from a voltage source having first and second terminals in accordance with a controller, said high speed write driver comprising:

input voltage control means for controlling a voltage applied to the inductive head from the voltage source;

current supply means for supplying current to the inductive head element;

damping means for damping the inductive head element; and overshoot suppressor means for suppressing overshoot of said input voltage control means;

wherein said input control means comprises:

first switching means for selectively switching the voltage source to the first terminal of the inductive head element; and second switching means for selectively switching the voltage source to the second terminal of the inductive head element;

wherein said damping means is in communication with the first and second terminals of the inductive head element; and wherein said overshoot suppressor means comprises:

third switching means for selectively switching the voltage source to the first terminal of the inductive head element; and fourth switching means for selectively switching the voltage source to the second terminal of the inductive head element, wherein said current supply means comprises:

first current source means for supplying current to the first terminal of the inductive head element from the second terminal of the voltage source; and second current source means for supplying current to the second terminal of the inductive head element from a second terminal of the voltage source, said current supply means further comprises first current boost means for providing a current boost to the first terminal of the inductive head element and a second current boost means for providing a current boost to the second terminal of the inductive head element.

26. A high speed write driver according to claim 25, wherein the controller provides:

a first clock signal to said first switching means and said first current source means;

a complement of the first clock signal to said second switching means and said second current source means;

a first boost signal to said first current boost means which is triggered by a rising edge of the first clock signal;

a second boost signal to said second current boost means which is triggered by a rising edge of the complement of the first clock signal;

a damping control signal to said damping means which is triggered by the rising edge of the first clock signal and the rising edge of the complement of the first clock signal;

a first overshoot control signal to said third switching means which is triggered by a falling edge of the first boost signal; and a second overshoot control signal to said fourth switching means which is triggered by a falling edge of the second boost signal.

27. A high speed write driver to drive an inductive head element having first and second terminals from a voltage source having first and second terminals in accordance with a controller, said high speed write driver comprising:

input voltage control means for controlling a voltage applied to the inductive head from the voltage source;

current supply means for supplying current to the inductive head element;

damping means for damping the inductive head element; and overshoot suppressor means for suppressing overshoot of said input voltage control means;

said current supply means further comprises a current booster.

28. A high speed write driver according to claim 27, wherein said input control means comprises:

first switching means for selectively switching the voltage source to the first terminal of the inductive head element; and second switching means for selectively switching the voltage source to the second terminal of the inductive head element;

wherein said damping means is in communication with the first and second terminals of the inductive head element; and wherein said overshoot suppressor means comprises:
third switching means for selectively switching the voltage source to the first terminal of the inductive head element; and
fourth switching means for selectively switching the voltage source to the second terminal of the inductive head element.

29. A high speed write driver according to claim 27, wherein said damping means comprises a controllable resistance.

30. A high speed write driver according to claim 27, wherein said current supply means comprises:

first current source means for supplying current to the first terminal of the inductive head element from the second terminal of the voltage source; and second current source means for supplying current to the second terminal of the inductive head element from a second terminal of the voltage source.

31. A high speed write driver to drive an inductive head element having first and second terminals from a voltage source having first and second terminals in accordance with a controller, said high speed write driver comprising:

input voltage control and overshoot suppressor means for controlling a voltage applied to the inductive head and for suppressing voltage overshoot from the voltage source;

current supply means for supplying current to the inductive head element; and damping means for damping the inductive head element, wherein said input control and suppressor stage comprises:
first switching means for selectively switching the voltage source to the first terminal of the inductive head element; and
second switching means for selectively switching the voltage source to the second terminal of the inductive head element, and wherein said damping means is in communication with the first and second terminals of the inductive head element, wherein said current supply means comprises:
first current source means for supplying current to the first terminal of the inductive head element from the second terminal of the voltage source; and
a second current source means for supplying current to the second terminal of the inductive head element from the second terminal of the voltage source, said current supply means further comprises first current boost means for providing a current boost to the first terminal of the inductive head element and second current boost means for providing a current boost to the second terminal of the inductive head element.

32. A high speed write driver according to claim 31, wherein the controller provides:

a first clock signal to said first current source means;

a complement of the first clock signal to said second current source means;

a first boost signal to said first current boost means which is triggered by a rising edge of the first clock signal;

a second boost signal to said second current boost means which is triggered by a rising edge of the complement of the first control signal;

a damping control signal to said damping means which is triggered by the rising edge of the first clock signal and the rising edge of the complement of the first clock signal;

a first voltage and suppression control signal to said first switching means which is triggered by a falling edge of the first boost signal and a falling edge of the first clock signal; and a second voltage and suppression control signal to said second switching means which is triggered by a falling edge of the second boost signal and a falling edge of the complement of the first clock signal.

33. A high speed write driver to drive an inductive head element having first and second terminals from a voltage source having first and second terminals in accordance with a controller, said high speed write driver comprising:

input voltage control and overshoot suppressor means for controlling a voltage applied to the inductive head and for suppressing voltage overshoot from the voltage source;

current supply means for supplying current to the inductive head element; and damping means for damping the inductive head element, said current supply means further comprises a current booster.

34. A high speed write driver according to claim 33, wherein said input control and suppressor stage comprises:
   first switching means for selectively switching the voltage source to the first terminal of the inductive head element; and
   second switching means for selectively switching the voltage source to the second terminal of the inductive head element, and;
   wherein said damping means is in communication with the first and second terminals of the inductive head element.

35. A high speed write driver according to claim 33, wherein said damping means comprises a controllable resistance.

36. A high speed write driver according to claim 33, wherein said current supply means comprises:
   first current source means for supplying current to the first terminal of the inductive head element from the second terminal of the voltage source; and
   a second current source means for supplying current to the second terminal of the inductive head element from the second terminal of the voltage source.

37. A storage system comprising:
   inductive head means for inductively communicating with a magnetic medium having first and second terminals;
   control means for controlling said storage system;
   voltage means for supplying a voltage;
   high speed write driving means for driving said inductive means with a voltage from said voltage means in accordance with said control means, said high speed write driver comprising:
      input voltage control means for controlling a voltage applied to the inductive head from said voltage source;
      current supply means for supplying current to said inductive head element;
      damping means for damping said inductive head element; and
      overshoot suppressor means for suppressing overshoot of said input voltage control means,
      wherein said input control means comprises:
         first switching means for selectively switching said voltage means to the first terminal of said inductive head means; and
         second switching means for selectively switching said voltage means to the second terminal of said inductive head means;
      wherein said damping means is in communication with the first and second terminals of said inductive head means; and
      wherein said overshoot suppressor means comprises:
         third switching means for selectively switching said voltage means to the first terminal of said inductive head means; and
         fourth switching means for selectively switching said voltage means to the second terminal of said inductive head means,
      wherein said current supply means comprises:
         first current source means for supplying current to the first terminal of said inductive head means from a second terminal of said voltage means; and
         second current source means for supplying current to the second terminal of said inductive head means from the second terminal of said voltage means,
      said current supply means further comprises first current boost means for providing a current boost to the first terminal of said inductive head means and a second current boost means for providing a current boost to the second terminal of said inductive head means.

38. A storage system comprising:
   inductive head means for inductively communicating with a magnetic medium having first and second terminals;
   control means for controlling said storage system;
   voltage means for supplying a voltage;
   high speed write driving means for driving said inductive means with a voltage from said voltage means in accordance with said control means, said high speed write driver comprising:
      input voltage control means for controlling a voltage applied to the inductive head from said voltage source;
      current supply means for supplying current to said inductive head element;
      damping means for damping said inductive head element; and
      overshoot suppressor means for suppressing overshoot of said input voltage control means,
      wherein said controller generates:
         a first clock signal to said first switching means and said first current source means;
         a complement of the first clock signal to said second switching means and said second current source means;
         a first boost signal to said first current boost means which is triggered by a rising edge of the first clock signal;
         a second boost signal to said second current boost means which is triggered by a rising edge of the complement of the first clock signal;
         a damping control signal to said damping means which is triggered by the rising edge of the first clock signal and the rising edge of the complement of the first clock signal;
         a first overshoot control signal to said third switching means which is triggered by a falling edge of the first boost signal; and
         a second overshoot control signal to said fourth switching means which is triggered by a falling edge of the second boost signal.

39. A storage system comprising:
   inductive head means for inductively communicating with a magnetic medium having first and second terminals;
   control means for controlling said storage system;
   voltage means for supplying a voltage;
   high speed write driving means for driving said inductive means with a voltage from said voltage means in accordance with said control means, said high speed write driver comprising:
      input voltage control means for controlling a voltage applied to the inductive head from said voltage source;
      current supply means for supplying current to said inductive head element;
      damping means for damping said inductive head element; and overshoot suppressor means for suppressing overshoot of said input voltage control means, said current supply means further comprises a current booster.

40. A storage system according to claim 39, wherein said input control means comprises:

first switching means for selectively switching said voltage means to the first terminal of said inductive head means; and second switching means for selectively switching said voltage means to the second terminal of said inductive head means;

wherein said damping means is in communication with the first and second terminals of said inductive head means; and wherein said overshoot suppressor means comprises:

third switching means for selectively switching said voltage means to the first terminal of said inductive head means; and fourth switching means for selectively switching said voltage means to the second terminal of said inductive head means.

41. A storage system according to claim 39, wherein said damping means comprises a controllable resistance.

42. A storage system according to claim 39, wherein said current supply means comprises:

first current source means for supplying current to the first terminal of said inductive head means from a second terminal of said voltage means; and second current source means for supplying current to the second terminal of said inductive head means from the second terminal of said voltage means.

43. A storage system comprising:

inductive head means for inductively communicating with a magnetic medium having first and second terminals;

control means for controlling said storage system;

voltage means for supplying a voltage;

high speed write driving means for driving said inductive head means with a voltage from said voltage means in accordance with said control means, said high speed write driver comprising:

input voltage control and overshoot suppressor means for controlling a voltage applied to the inductive head means and for suppressing voltage overshoot from the voltage means;

current supply means for supplying current to the inductive head means; and damping means for damping the inductive head means, wherein said input control and suppressor stage comprises:

first switching means for selectively switching said voltage means to the first terminal of said inductive head means; and second switching means for selectively switching said voltage means to the second terminal of said inductive head means, and wherein said damping means is in communication with the first and second terminals of said inductive head means, wherein said current supply means comprises:

first current means means for supplying current to the first terminal of said inductive head means from a second terminal of said voltage means; and a second current source means for supplying current to the second terminal of said inductive head means from a second terminal of said voltage means, said current supply means further comprises first current boost means for providing a current boost to the first terminal of said inductive head means and second current boost means for providing a current boost to the second terminal of said inductive head means.

44. A storage system according to claims 43, wherein said controller generates:

a first clock signal to said first current source means;

a complement of the first clock signal to said second current source means;

a first boost signal to said first current boost means which is triggered by a rising edge of the first clock signal;

a second boost signal to said second current boost means which is triggered by a rising edge of the complement of the first control signal;

a damping control signal to said damping means which is triggered by the rising edge of the first clock signal and the rising edge of the complement of the first clock signal;

a first voltage and suppression control signal to said first switching means which is triggered by a falling edge of the first boost signal and a falling edge of the first clock signal; and a second voltage and suppression control signal to said second switching means which is triggered by a falling edge of the second boost signal and a falling edge of the complement of the first clock signal.

45. A storage system comprising:

inductive head means for inductively communicating with a magnetic medium having first and second terminals;

control means for controlling said storage system;

voltage means for supplying a voltage;

high speed write driving means for driving said inductive head means with a voltage from said voltage means in accordance with said control means, said high speed write driver comprising:

input voltage control and overshoot suppressor means for controlling a voltage applied to the inductive head means and for suppressing voltage overshoot from the voltage means;

current supply means for supplying current to the inductive head means; and damping means for damping the inductive head means, wherein said current supply means further comprises a current booster.

46. A storage system according to claim 45, wherein said input control and suppressor stage comprises:

first switching means for selectively switching said voltage means to the first terminal of said inductive head means; and second switching means for selectively switching said voltage means to the second terminal of said inductive head means, and;

wherein said damping means is in communication with the first and second terminals of said inductive head means.

47. A storage system according to claim 45, wherein said damping means comprises a controllable resistance.

48. A storage system according to claim 45, wherein said current supply means comprises:

first current means means for supplying current to the first terminal of said inductive head means from a second terminal of said voltage means; and a second current source means for supplying current to the second terminal of said inductive head means from a second terminal of said voltage means.

49. A method for driving an inductive head element having first and second terminals from a voltage source having first and second terminals in accordance with a controller, said method comprising the steps of:
(a) controlling a voltage applied to the inductive head from the voltage source;
(b) supplying current to the inductive head element;
(c) damping the inductive head element; and
(e) suppressing overshoot of step (a),
wherein said step (b) further comprises the steps of providing a current boost to the first terminal of the inductive head element and providing a current boost to the second terminal of the inductive head element.

50. A method according to claim 49, wherein step (a) comprises the steps of:
(e) selectively switching the voltage source to the first terminal of inductive head element; and
(f) selectively switching the voltage source to the second terminal of inductive head element;
wherein step (d) comprises the steps of:
(g) selectively switching the voltage source to the first terminal of inductive head element; and
(h) selectively switching the voltage source to the second terminal of inductive head element.

51. A method according to claim 49, wherein step (c) comprises the step of controlling a resistance.

52. A method according to claim 49, wherein step (b) comprises the steps of:
supplying current to the first terminal of the inductive head element from the second terminal of the voltage source; and
supplying current to the second terminal of the inductive head element from the second terminal of the voltage source.

53. A method for driving an inductive head element having first and second terminals from a voltage source having first and second terminals in accordance with a controller, said method comprising the steps of:
(a) controlling a voltage applied to the inductive head from the voltage source;
(b) supplying current to the inductive head element;
(c) damping the inductive head element; and
(d) suppressing overshoot of step (a),
wherein step (a) comprises the steps of:
(e) selectively switching the voltage source to the first terminal of inductive head element; and
(f) selectively switching the voltage source to the second terminal of inductive head element;
wherein step (d) comprises the steps of:
(g) selectively switching the voltage source to the first terminal of inductive head element; and
(h) selectively switching the voltage source to the second terminal of inductive head element,
wherein step (b) comprises the steps of:
supplying current to the first terminal of the inductive head element from the second terminal of the voltage source; and
supplying current to the second terminal of the inductive head element from the second terminal of the voltage source,
said step (b) further comprises the steps of providing a current boost to the first terminal of the inductive head element and providing a current boost to the second terminal of the inductive head element.

54. A method for driving an inductive head element having first and second terminals from a voltage source having first and second terminals in accordance with a controller, said method comprising the steps of:
(a) controlling a voltage applied to the inductive head from the voltage source;
(b) supplying current to the inductive head element;
(c) damping the inductive head element; and
(d) suppressing overshoot of step (a),
wherein step (a) comprises the steps of:
(e) selectively switching the voltage source to the first terminal of inductive head element; and
(f) selectively switching the voltage source to the second terminal of inductive head element;
wherein step (d) comprises the steps of:
(g) selectively switching the voltage source to the first terminal of inductive head element; and
(h) selectively switching the voltage source to the second terminal of inductive head element,
wherein step (b) comprises the steps of:
supplying current to the first terminal of the inductive head element from the second terminal of the voltage source; and
supplying current to the second terminal of the inductive head element from the second terminal of the voltage source,
wherein the controller provides:
a first clock signal to said first switching means and said first current source means;
a complement of the first clock signal to said second switching means and said second current source means;
a first boost signal to said first current boost means which is triggered by a rising edge of the first clock signal;
a second boost signal to said second current boost means which is triggered by a rising edge of the complement of the first clock signal;
a damping control signal to said damping means which is triggered by the rising edge of the first clock signal and the rising edge of the complement of the first clock signal;
a first overshoot control signal to said third switching means which is triggered by a falling edge of the first boost signal; and
a second overshoot control signal to said fourth switching means which is triggered by a falling edge of the second boost signal.

* * * * *